United States Patent
Faguet et al.

(10) Patent No.: US 10,115,586 B2
(45) Date of Patent: Oct. 30, 2018

(54) METHOD FOR DEPOSITING A PLANARIZATION LAYER USING POLYMERIZATION CHEMICAL VAPOR DEPOSITION

(71) Applicant: Tokyo Electron Limited, Minato-ku, Tokyo (JP)

(72) Inventors: Jacques Faguet, Austin, TX (US); Bruce A. Altemus, Esperance, NY (US); Kazuya Ichiki, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/587,570

(22) Filed: May 5, 2017

(65) Prior Publication Data

US 2017/0323784 A1    Nov. 9, 2017

Related U.S. Application Data

(60) Provisional application No. 62/333,262, filed on May 8, 2016.

(51) Int. Cl.
*H01L 21/02* (2006.01)
*C23C 16/48* (2006.01)
*C23C 16/56* (2006.01)

(52) U.S. Cl.
CPC ........ *H01L 21/02271* (2013.01); *C23C 16/48* (2013.01); *C23C 16/56* (2013.01); *H01L 21/02118* (2013.01); *H01L 21/02205* (2013.01); *H01L 21/02321* (2013.01)

(58) Field of Classification Search
None
See application file for complete search history.

(56) References Cited

U.S. PATENT DOCUMENTS

| 8,216,640 | B2 | 7/2012 | Chao et al. |
| 2002/0018912 | A1 | 2/2002 | Jung et al. |
| 2002/0122828 | A1 | 9/2002 | Liu |

(Continued)

FOREIGN PATENT DOCUMENTS

| JP | 11198327 | 7/1999 |
| JP | 2002069013 | 3/2002 |

(Continued)

OTHER PUBLICATIONS

Korean Intellectual Property Office, International Search Report and Written Opinion for International Application No. PCT/US2016/041925, dated Nov. 10, 2016, 13 pages.

(Continued)

*Primary Examiner* — Angel Roman (57) ABSTRACT

A method is provided for depositing a planarization layer over features on a substrate using sequential polymerization chemical vapor deposition. According to one embodiment, the method includes providing a substrate containing a plurality of features with gaps between the plurality of features, delivering precursor molecules by gas phase exposure to the substrate, adsorbing the precursor molecules on the substrate to at least substantially fill the gaps with a layer of the adsorbed precursor molecules, and reacting the precursor molecules to form a polymer layer that at least substantially fills the gaps.

20 Claims, 5 Drawing Sheets

(56) References Cited

U.S. PATENT DOCUMENTS

| | | | |
|---|---|---|---|
| 2002/0182845 A1* | 12/2002 | Miyano | C23C 16/045 438/618 |
| 2005/0065028 A1 | 3/2005 | Pellin et al. | |
| 2009/0116111 A1 | 5/2009 | Toyama et al. | |
| 2009/0272322 A1 | 11/2009 | Fujinami et al. | |
| 2010/0047551 A1 | 2/2010 | Childs et al. | |
| 2013/0017682 A1 | 1/2013 | Bruce et al. | |
| 2013/0017688 A1 | 1/2013 | Dubois et al. | |
| 2013/0056874 A1* | 3/2013 | Darnon | H01L 21/3105 257/773 |
| 2013/0109262 A1 | 5/2013 | Zhou | |
| 2013/0316087 A1 | 11/2013 | Ahn et al. | |
| 2016/0280536 A1 | 9/2016 | Sugita et al. | |
| 2017/0037509 A1* | 2/2017 | Faguet | C23C 16/50 |
| 2017/0137943 A1* | 5/2017 | Mohn | H01L 21/67115 |

FOREIGN PATENT DOCUMENTS

| | | |
|---|---|---|
| JP | 2006152352 | 6/2006 |
| JP | 2009132876 | 6/2009 |
| JP | 2001504989 | 10/2009 |
| JP | 2009270145 | 11/2009 |
| JP | 2010229054 | 10/2010 |
| JP | 2013534970 | 9/2013 |
| JP | 2014188656 | 10/2014 |
| WO | 1998008249 A1 | 2/1998 |
| WO | 2011156055 A1 | 12/2011 |

OTHER PUBLICATIONS

Frot, T. et al.,"Application of the Protection/Deprotection Strategy to the Science of Porous Materials," Adv. Mater. 2011, 23, pp. 2828-2832.

Frot, T. et al.,"Post Porosity Plasma Protection: Scaling of Efficiency with Porosity," Adv. Funct. Mater. 2012, 22(14), pp. 1-8.

Frot, T. et al., "Post-Porosity Plasma Protection: A New Platform to Integrate k<2.4 Ultral Low-k Materials," Future Fab International, 39, Oct. 2011.

Dargaville, T.R. et al., "High energy radiation grafting of fluoropolymers," Prog. Polym. Sci. 28 (2003), pp. 1355-1376.

Senkevich, J.J. et al., "Molecular Caulk: A Pore Sealing Technology of Ultra-low k Dielectrics," Mat. Res. Soc. Symp. Proc. vol. 812, 2004, pp. F1.2.1-F. 1.2.10.

Taiwan Intellectual Property Office, Notification of Examination Opinions for Taiwan Patent Application No. 105122004 dated Jul. 3, 2017, 6 pages.

Japan Patent Office, Notice of Reason(s) for Rejection for Japan Patent Application No. 2017-092414, dated Feb. 27, 2018, 5 pages.

Korean Intellectual Property Office, Office Action for Korean Patent Application No. 10-2017-0057278, dated Apr. 20, 2018, 11pages.

* cited by examiner

Initiation:

Propagation:

Termination:

METHOD FOR DEPOSITING A PLANARIZATION LAYER USING POLYMERIZATION CHEMICAL VAPOR DEPOSITION

CROSS-REFERENCE TO RELATED APPLICATIONS

This application is related to and claims priority to U.S. Provisional Patent Application Ser. No. 62/333,262 filed on May 8, 2016, the entire contents of which are herein incorporated by reference.

FIELD OF INVENTION

The invention relates to a method for depositing a planarization layer using polymerization chemical vapor deposition. The method can be used for topography planarization of a substrate containing a plurality of features with gaps between the plurality of features.

BACKGROUND OF THE INVENTION

Fabrication flows for microelectromechanical systems (MEMS) and IC architectures incorporate smaller and smaller feature sizes. This places a restraint on the surface flatness requirement for obtaining these critical dimensions (CDs). As such, filling/planarization processes are considered some of the critical process steps for device fabrication. Currently, planarization layers are obtained by a multi-step process that includes spin coating and etching back in order to fill isolated/dense features uniformly. Consequently, a single step planarization technique that deposits a uniform film between isolated and dense features can improve the process efficiency.

SUMMARY OF THE INVENTION

A method is provided for depositing a planarization layer using polymerization chemical vapor deposition. The method can be used for topography planarization of a substrate containing a plurality of features with gaps between the plurality of features.

According to one embodiment, the method includes providing a substrate containing a plurality of features with gaps between the plurality of features, delivering precursor molecules by gas phase exposure to the substrate, adsorbing the precursor molecules on the substrate to at least substantially fill the gaps with a layer of the adsorbed precursor molecules, and reacting the precursor molecules to form a polymer layer that at least substantially fills the gaps.

DETAILED DESCRIPTION OF SEVERAL EMBODIMENTS

Methods for depositing a planarization layer over features on a substrate using polymerization chemical vapor deposition are described in a plurality of embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor substrate or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

"Features" as used herein can refer to many different types of features on substrates. One example includes a plurality of raised features on a semiconductor wafer. Another example includes a plurality of raised features on a semiconductor substrate, where the plurality of raised features form first and second regions on the substrate, and where the plurality of features in the first region having wider gaps than the plurality of features than the second region. This is commonly referred to as iso-dense regions on a substrate. However, other types of raised features on a substrate are contemplated and may be used.

According to one embodiment of the invention, a process sequence is described where precursor molecules (e.g., monomers) are exposed in gas phase to a substrate. The gas phase exposure results in adsorption of the precursor molecules on the substrate. The adsorption can be controlled through gas phase composition, gas pressure, substrate temperature, and $P_m/P_{sat}$ ratio, where $P_m$ refers to the partial pressure of the precursor molecules (monomers) and $P_{sat}$ refers to the saturation pressure of the precursor molecules at substrate surface temperature. The adsorbed precursor molecules form a polymer on the substrate through a polymerization process. The polymer has high molecular weight that provides thermal stability up to a temperature at which the lower molecular weight molecules may start to either desorb or decompose into lighter molecules that then desorb.

Figure 1:
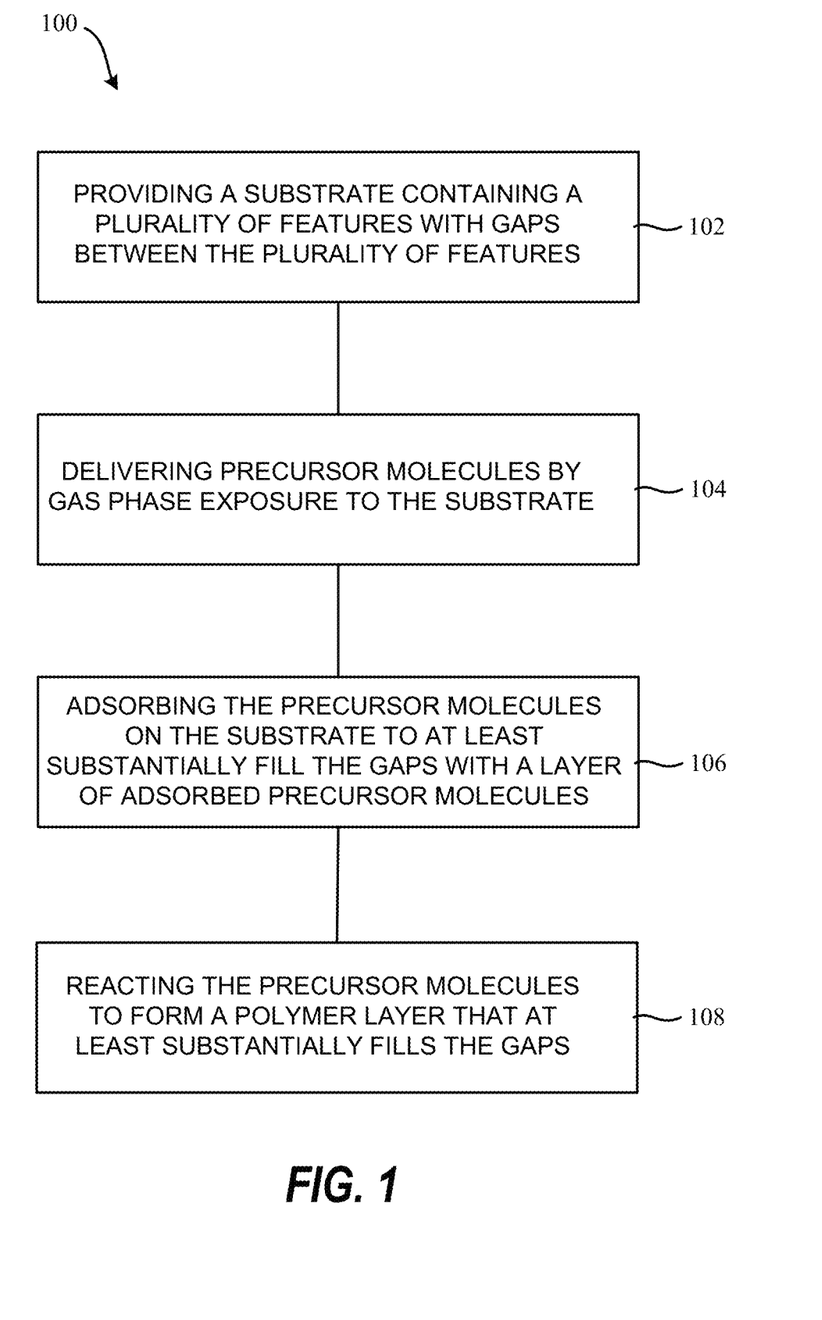
FIG. 1 is a process flow diagram for a polymerization process according to an embodiment of the invention.

Reference will now be made to the figures to illustrate some embodiments of the invention. FIG. 1 is a process flow diagram for a polymerization process according to an embodiment of the invention. The process flow 100 includes, in 102, providing a substrate containing a plurality of features with gaps between the plurality of features. According to one embodiment, a first plurality of features form a first region and a second plurality of features form a second region on the substrate, where the first plurality of features in the first region have wider gaps than the second plurality of features than the second region.

The process flow 100 further includes, in 104, delivering precursor molecules by gas phase exposure to the substrate, and in 106, adsorbing the precursor molecules on the substrate to at least substantially fill the gaps with a layer of the adsorbed precursor. The extent of adsorption of the precursor molecules on the substrate can be controlled through gas phase composition, gas pressure, substrate temperature, and $P_m/P_{sat}$ ratio. Once complete or near complete filling of the gaps with the adsorbed precursor molecules is achieved on the substrate, the gas phase exposure may be stopped.

According to some embodiments of the invention, the precursor molecules can include monomers or dimers of low molecular weight (<900 daltons) organic compounds. Examples include organic compounds that are capable of chain propagation of polymer chains when polymerization is triggered. In one example, the precursor molecules can include a vinyl functional group (—C═C—) or a carbon-carbon triple bond (—C≡C—). The name vinyl is used for any compound that contains that carbon-carbon double bond, namely R—C═C—R', where R and R' are any group of atoms. Examples include alkenes which are unsaturated hydrocarbons containing at least one carbon-carbon double bond. The simplest acyclic alkene with only one double bond and no other functional groups, form a homologous series of hydrocarbons with the general formula $C_nH_{2n}$. The simplest alkene is ethylene ($C_2H_4$) which is a colorless gas at room temperature.

According to some embodiments of the invention, the precursor molecules may include acrylates, for example neopentyl methacrylate (nPMA) precursor molecules.

In FIG. 1, the process flow 100 further includes, in 108, reacting the precursor molecules to form a polymer layer that at least substantially fills the gaps. According to one embodiment, steps 106 and 108 may be performed simultaneously, sequentially, or over-lapping one another.

The polymerization process can be step-by-step growth. One example is condensation polymerization where molecules join together—losing small molecules as by-products, for example water or methanol. In dehydration synthesis, monomers with hydroxyl groups (—OH) on either end react with monomers with freely ionized (—H) on either end to form a polymer by losing water. For example, nylon is a condensation polymer formed by reacting a di-amine (R—(NH$_2$)$_2$) with a di-carboxyl acid (R'—(COOH)$_2$). Polyester is a condensation polymer formed by reacting a diol (R—(OH)$_2$) with a di-acid (R'—(COOH)$_2$).

According to one embodiment, the precursor molecules can include two or more different reactive molecules. In one example, one precursor molecule contains a hydroxyl group (—OH) and another precursor molecule contains an amine group (—NH$_2$). In another example, one precursor molecule contains a hydroxyl group (—OH) and another precursor molecule contains a carboxylic acid group (—COOH) or an acyl chloride (—COCl).

According to one embodiment, the reacting can include exposing the layer of the adsorbed precursor molecules to cations and free radicals that are generated in a plasma.

During or following the gas phase exposure of the precursor molecules, the substrate may be heat-treated to provide kinetic control over the polymerization profile. In one example, this may be achieved by generating a vertical temperature gradient across a thickness of the layer of the adsorbed precursor molecules, extending from the top surface of the layer of the adsorbed precursor molecules to a bottom surface of the layer of the adsorbed precursor molecules. The temperature can either increase or decrease from the top surface of the layer of the adsorbed precursor molecules to the bottom surface of the adsorbed precursor molecules. The temperature can be increased/decreased by applying more/less heat to substrate from the top surface than from the bottom surface.

A polymerization process is a process of reacting monomer or dimer molecules together in a chemical reaction to form polymer chains or three-dimensional networks. The polymerization process may be characterized by the step-growth reaction between functional groups of monomers or dimers, or chain-growth polymerization involving linking together molecules by incorporating double or triple carbon-carbon bonds.

Chain-growth polymerization is a polymerization process where unsaturated precursor molecules (e.g., monomers) add onto the active site of a growing polymer chain one at a time. Examples of unsaturated monomers include alkene and alicyclic compounds. Growth of the polymer occurs only at one (or possible more) ends and addition of each monomer unit regenerates the active site. This type of polymerization results in high molecular weight polymer being formed at low conversion rate. This final weight is determined by the rate of propagation compared to the rate of individual chain termination, which includes both chain transfer and chain termination steps.

Figure 2A:
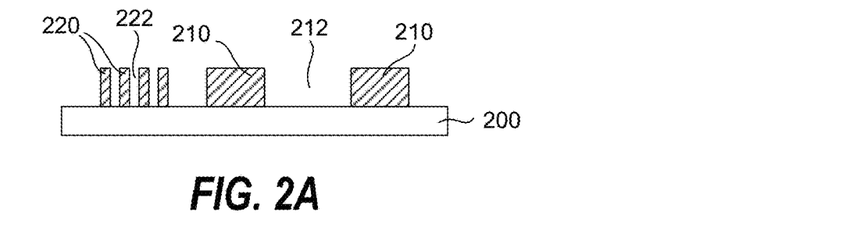
FIGS. 2A-2E schematically illustrate through cross-sectional views a chain-growth polymerization process according to one embodiment of the invention.

FIGS. 2A-2E schematically illustrate through cross-sectional views a chain-growth polymerization process according to one embodiment of the invention. FIG. 2A shows a substrate 200 containing a plurality of features 220, 210 with gaps 222, 212 between the plurality of features 220, 210. According to one embodiment, the plurality of features 210 form a first region and the plurality of features 220 form a second region on the substrate 200, where the plurality of features 210 in the first region have wider gaps than the plurality of features 220 than the second region.

Figure 2B:
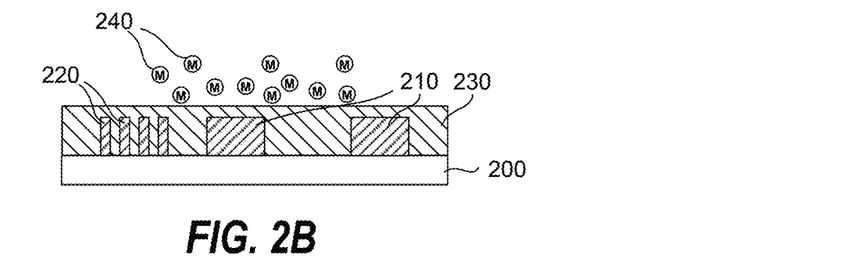

FIG. 2B shows delivery of precursor molecules 240 by gas phase exposure to the substrate 200, and adsorption of the precursor molecules 240 on the substrate 200 to at least substantially fill the gaps 212, 222 with a layer 230 of the adsorbed precursor. In the example shown in FIG. 2B, the layer 230 overfills the gaps. The extent of adsorption of the precursor molecules 240 on the substrate 200 can be controlled through gas phase composition, gas pressure, substrate temperature, and $P_m/P_{sat}$ ratio. Once complete or near complete filling of the gaps 212, 222 with the adsorbed precursor molecules 240 is achieved on the substrate 200, the gas phase exposure may be stopped.

Figure 2C:
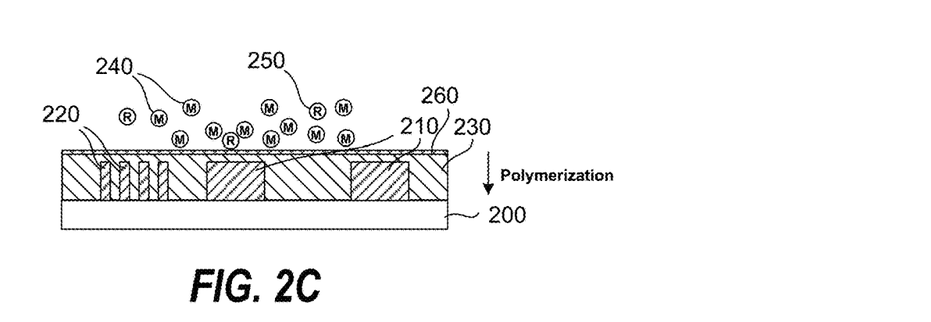

FIG. 2C shows polymerization that is initiated on the layer 230 of the adsorbed precursor using, for example, free radicals 250. In one example, the free radicals 250 may be formed by flowing initiator molecules near a hot filament that cracks the initiator molecules. The temperature of the hot filament can, for example, be about 300° C., or less. Once initiated, the polymerization proceeds through the layer 230 of the adsorbed precursor via chain-growth of polymer layer 260. Examples of initiator molecules include peroxides which are compounds containing an oxygen-oxygen single bond. The simplest stable peroxide is hydrogen peroxide (H—O—O—H). Examples of other peroxides include R—O—O—R', R—O—O—H, and R—CO—O—O—H, where R and R' mark hydrocarbon moieties.

Figure 2D:
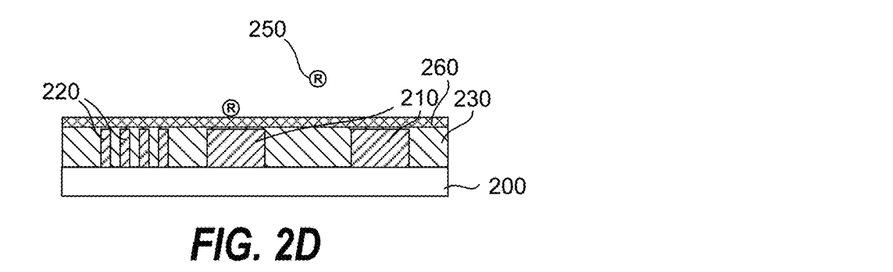
Figure 2E:
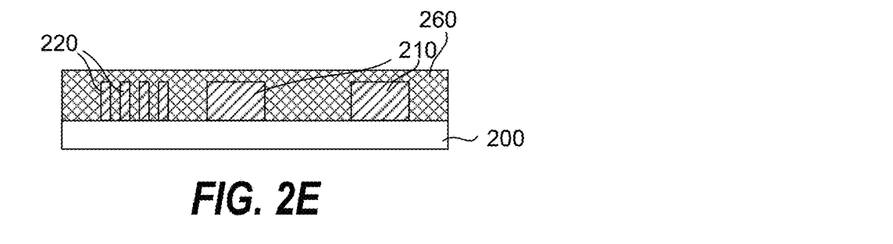

FIG. 2D shows further polymerization of the layer 230 of the adsorbed precursor, and FIG. 2E shows a fully polymerized polymer layer 260. In the example shown in FIG. 22, the polymer layer 260 overfills the gaps to form a planarization layer.

Figure 3:
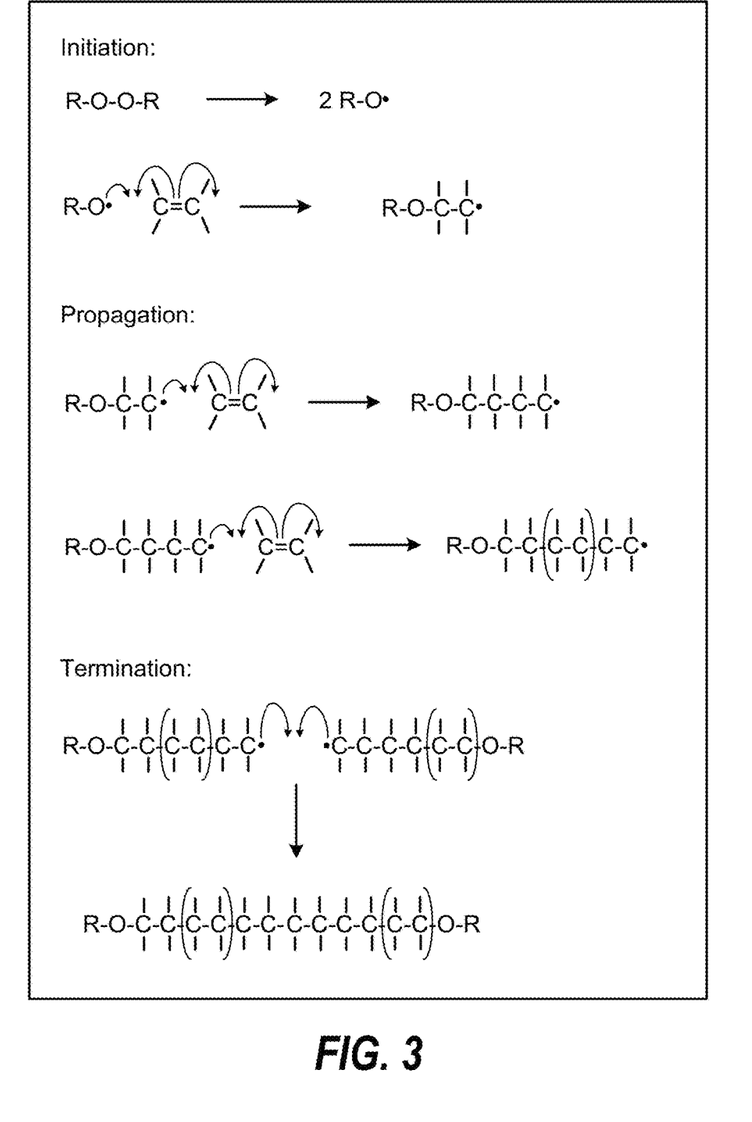
FIG. 3 schematically shows free radical polymerization according to an embodiment of the invention.

FIG. 3 schematically shows free radical polymerization according to an embodiment of the invention. The free radical polymerization process may be described by initiation, propagation, and termination. The initiation refers to formation of a free radical (e.g., R—O.) from pyrolysis of an initiator molecule (e.g., R—O—O—R) at low temperature. The free radical is a chemical trigger that reacts with the adsorbed precursor molecule (e.g., $C_2H_4$) to generate a polymer free radical (e.g., R—O—C—C.). Propagation refers to a further reaction of the polymer free radical with another precursor molecule, where a length of the polymer free radical is increased with each reaction. Termination refers to the reaction and quenching of two polymer free radicals.

Figure 4A:
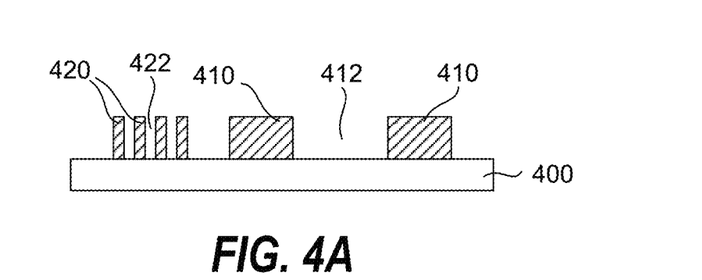
FIGS. 4A-4C schematically illustrate through cross-sectional views a method for a step-growth polymerization process according to one embodiment of the invention.
Figure 4B:
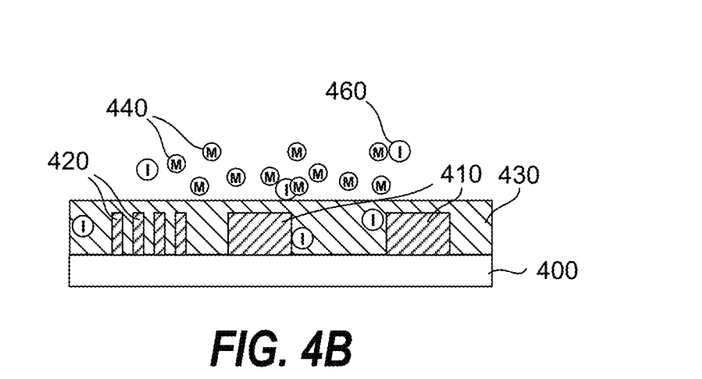
Figure 4C:
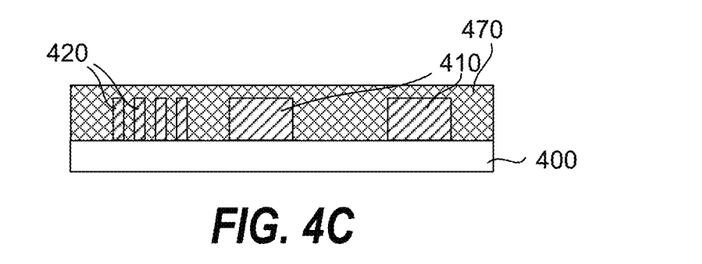

FIGS. 4A-4C schematically illustrate through cross-sectional views a method for a step-growth polymerization process according to one embodiment of the invention. Step-growth polymerization is a type of mechanism in which monomers can react to first form dimers, then trimers, longer oligomers and eventually long chain polymers. Due to the nature of the polymerization mechanism, a high extent of reaction is required to achieve high molecular weight.

FIG. 4A shows a substrate 400 containing a plurality of features 410, 420 with gaps 412, 422 between the plurality of features 410, 420. According to one embodiment, the plurality of features 410 form a first region and the plurality of features 420 form a second region on the substrate 400, where the plurality of features 410 in the first region have wider gaps than the plurality of features 420 than the second region.

FIG. 4B shows delivery of precursor molecules 440 and initiator molecules 460 by gas phase exposure to the substrate 400. According to embodiments of the invention, the gas phase exposure of the precursor molecules 440 and the initiator molecules 460 may be performed simultaneously, sequentially, or over-lapping one another. According to one embodiment, the gas phase exposure of the precursor molecules 440 and the initiator molecules 460 may be performed simultaneously, thereby resulting in bottom-up polymerization and formation of a conformal polymer film over the features. A prolonged gas phase exposure may be used to completely fill the features with the polymer film. In one example, the initiator molecules 460 may first be grafted on the substrate 400, and thereafter, the gas phase exposure of the precursor molecules 440 results in polymerization on the substrate 400.

The initiator molecules 460 can decompose to form free radicals that initiate step-growth of a polymer. The formation of the free radicals from the initiator molecules 460 can, for example, be triggered by temperature and/or electromagnetic radiation. As depicted in FIG. 4C, polymer propagation proceeds until a fully polymerized layer 470 is formed.

According to one embodiment, the polymerization process may be enhanced by exposing the substrate to cross-linker molecules. This can be performed in parallel or in sequence to the gas phase exposure to the precursor molecules, initiator molecules and/or free radicals. The cross-linker molecules have more than one reactive site per molecule of which reactions with precursor molecules can increase the degree of crosslinking of the final polymer. The degree of crosslinking can be used to adjust the materials properties of the polymer, e.g., the molecular weight and the thermal decomposition onset temperature.

According to one embodiment, the polymerization process may be performed by heat-treating the substrate in the presence of an inert gas or a mixture of a reactive gas (e.g., $O_2$, $H_2$, or a combination thereof) and an inert gas. According to another embodiment, the polymerization process may be triggered by exposing the substrate to electromagnetic (EM) radiation, where the EM radiation can include emission at a wavelength within the ultraviolet (UV) spectrum, visible spectrum, infrared (IR) spectrum, or microwave spectrum, or combination thereof.

The EM radiation may include ultraviolet (UV) radiation. The UV radiation may include, or consist essentially of UV wavelengths greater than or equal to 200 nm. Alternatively, the UV radiation may include, or consist essentially of UV wavelengths greater than or equal to 220 nm. Alternatively, the UV radiation may include, or consist essentially of UV wavelengths greater than or equal to 240 nm. Alternatively, the UV radiation may include, or consist essentially of UV wavelengths greater than or equal to 300 nm. Longer UV wavelengths can lower the risk of damage to the substrate, and reduce contamination of a metallized pattern.

The exposure to UV radiation may include substantially monochromatic radiation, or polychromatic radiation. The UV radiation may be applied continuously, or it may be pulsed. For example, the exposure to UV radiation may cycle between a high and a low UV intensity, where an exposure time for exposure to said high UV intensity is less than 100 msec, or less than 10 msec, or less than 1 msec.

The exposure to UV radiation may further include exposure to infrared (IR) radiation. The IR radiation may include substantially monochromatic radiation, or polychromatic radiation. The IR radiation may be applied continuously, or it may be pulsed. For example, the exposure to IR radiation may cycle between a high and a low IR intensity, where an exposure time for exposure to said high IR intensity is less than 100 msec, or less than 10 msec, or less than 1 msec.

During exposure to EM radiation, the substrate may be translated, or rotated. Additionally, or alternatively, the EM radiation may be scanned across the substrate. Multiple beams of EM radiation may be produced and scanned across the substrate to improve throughput. Multiple passes of a beam of EM radiation may be performed to achieve the desired level of polymerization. As an example, the substrate may be exposed to UV radiation, such as a UV flash exposure, followed by selective heating via a beam of EM radiation, such as UV or IR.

Figure 5A:
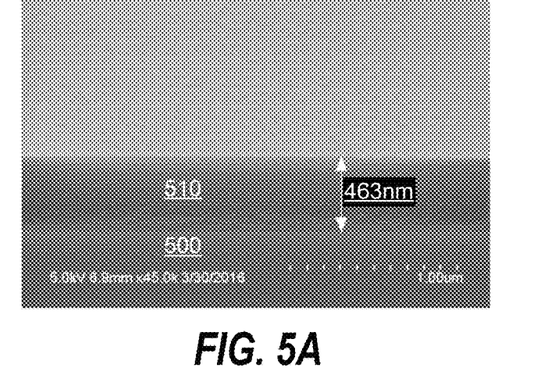
FIGS. 5A-5C show experimental results for depositing a planarization layer using polymerization chemical vapor deposition according to an embodiment of the invention.
Figure 5B:
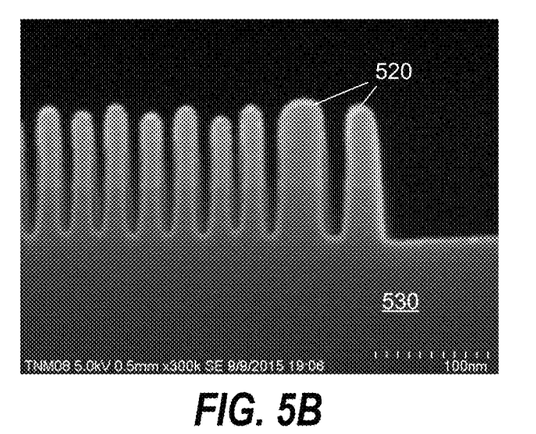
Figure 5C:
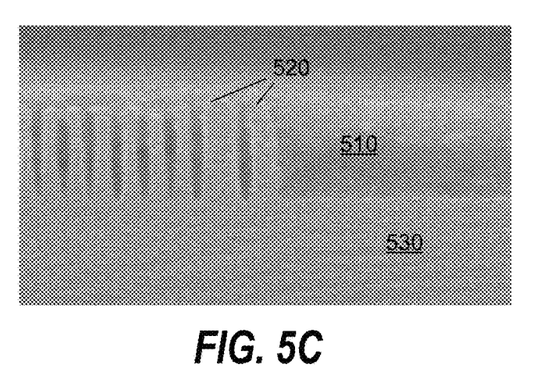

FIGS. 5A-5C show experimental results for depositing a planarization layer using polymerization chemical vapor deposition according to an embodiment of the invention. Shown in the cross-sectional scanning electron spectroscopy (SEM) image in FIG. 5A, a 463 nm thick polymer film 510 was formed on a flat substrate 500 using neopentyl methacrylate (nPMA) precursor molecules. In this example, the nPMA monomer and an initiator were sequentially introduced into a process chamber. First, a nPMA monomer film was adsorbed onto the substrate under a supersaturated condition ($P_m/P_{sat}>1$), followed by introduction of an initiator into the process chamber once a desired thickness of the adsorbed nPMA monomer film was obtained. The nPMA monomer film was then polymerized from the top down, due to the polymerization propagation rate being higher than a desorption rate of the adsorbed nPMA monomer film. As shown in FIG. 5A, the resulting polymer film was smooth with low roughness.

FIG. 5B shows a cross-sectional SEM image of a patterned substrate having features 520 with an aspect ratio (AR) of about 5 on a substrate 530.

FIG. 5C shows the patterned substrate of FIG. 5B following deposition of a 120 nm thick polymer film 530 deposited on the features 520 using nPMA and an initiator according to an embodiment of the invention. Polymer thickness over the isolated and dense features was observed to be similar across the patterned wafer. This is thought to be due to surface tension driven self-planarization of the adsorbed nPMA monomer film across the patterned wafer. This occurs when the film (pseudo liquid) thickness is greater than the surface topography.

A method for depositing a planarization layer using polymerization chemical vapor deposition has been disclosed in various embodiments. Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method for processing a substrate, the method comprising:
    providing a substrate containing a plurality of features with gaps between the plurality of features;
    delivering precursor molecules by gas phase exposure to the substrate;
    adsorbing the precursor molecules on the substrate to at least substantially fill the gaps with a layer of the adsorbed precursor molecules; and
    reacting the precursor molecules to form a polymer layer that at least substantially fills the gaps.

2. The method of claim 1, wherein the polymer layer overfills the gaps.

3. The method of claim 1, wherein the adsorbing and reacting have at least partial temporal overlap.

4. The method of claim 1, wherein the adsorbing and reacting have no partial temporal overlap.

5. The method of claim 1, wherein the plurality of features form first and second regions on the substrate, and wherein the plurality of features in the first region having wider gaps than the plurality of features than the second region.

6. The method of claim 5, wherein the polymer layer overfills the gaps, the method further comprising planarizing the polymer layer.

7. The method of claim 1, wherein the precursor molecules include an acrylate.

8. The method of claim 1, wherein the precursor molecules include monomers, dimers or oligomers of organic compounds that are capable of polymerization.

9. The method of claim 1, wherein the precursor molecules include a vinyl functional group (—C=C—) or a carbon-carbon triple bond (—C≡C—).

10. The method of claim 1, wherein the precursor molecules include two or more different reactive molecules.

11. The method of claim 10, wherein one precursor molecule contains a hydroxyl group (—OH) and another precursor molecule contains an amine group (—NH$_2$).

12. The method of claim 10, wherein one precursor molecule contains a hydroxyl group (—OH) and another precursor molecule contains a carboxylic acid group (—COOH) or an acyl chloride (—COCl).

13. The method of claim 1, wherein the reacting is performed by heat-treating the substrate in a gaseous environment.

14. The method of claim 1, wherein the reacting is performed by exposing the substrate to electromagnetic (EM) radiation.

15. The method of claim 1, wherein the reacting includes free radicals formed from initiator molecules.

16. The method of claim 15, wherein the initiator molecules include a peroxide.

17. The method of claim 16, wherein the peroxide is selected from the group consisting of hydrogen peroxide (H—O—O—H), R—O—O—H, R—O—O—R', and R—CO—O—O—H, where R and R' are hydrocarbon moieties.

18. The method of claim 1, wherein the reacting includes exposing the layer of the adsorbed precursor molecules to cations and free radicals that are generated in a plasma.

19. The method of claim 1, further comprising
    generating a vertical temperature gradient across a thickness of the layer of the adsorbed precursor molecules from a top surface of the layer of the adsorbed precursor molecules to a bottom surface of the layer of the adsorbed precursor molecules.

20. The method of claim 1, further comprising
    delivering cross-linker molecules into the layer of the adsorbed precursor molecules, wherein the cross-linker molecules contain at least two reactive sites.

* * * * *